United States Patent
Young et al.

(10) Patent No.: US 10,225,961 B2
(45) Date of Patent: Mar. 5, 2019

(54) SYSTEM AND METHOD FOR COOLING POWER ELECTRONICS

(71) Applicant: General Electric Company, Schenectady, NY (US)

(72) Inventors: Henry Todd Young, Erie, PA (US); Sean Patrick Cillessen, Lawrence Park, PA (US)

(73) Assignee: GE Global Sourcing LLC, Norwalk, CT (US)

( * ) Notice: Subject to any disclaimer, the term of this patent is extended or adjusted under 35 U.S.C. 154(b) by 0 days.

(21) Appl. No.: 15/517,195

(22) PCT Filed: Nov. 18, 2015

(86) PCT No.: PCT/US2015/061336
§ 371 (c)(1),
(2) Date: Apr. 6, 2017

(87) PCT Pub. No.: WO2016/081596
PCT Pub. Date: May 26, 2016

(65) Prior Publication Data
US 2017/0311490 A1  Oct. 26, 2017

Related U.S. Application Data

(60) Provisional application No. 62/081,063, filed on Nov. 18, 2014.

(51) Int. Cl.
*H05K 7/20* (2006.01)

(52) U.S. Cl.
CPC ..... *H05K 7/20927* (2013.01); *H05K 7/20263* (2013.01); *H05K 7/20272* (2013.01)

(58) Field of Classification Search
CPC .......... H05K 7/20927; H05K 7/20263; H05K 7/20272
USPC ....................................................... 361/699
See application file for complete search history.

(56) References Cited

U.S. PATENT DOCUMENTS

| 3,067,830 | A |   | 12/1962 | Lee |   |
|---|---|---|---|---|---|
| 4,646,202 | A | * | 2/1987 | Hook | H05K 11/02 165/80.3 |
| 4,903,760 | A |   | 2/1990 | Joshi et al. |   |
| 5,513,490 | A |   | 5/1996 | Howell et al. |   |
| 5,585,681 | A | * | 12/1996 | Bitsche | B60K 1/00 310/54 |

(Continued)

OTHER PUBLICATIONS

International Search Report issued in connection with corresponding PCT application PCT/US2015/061336 dated Apr. 8, 2016.

(Continued)

*Primary Examiner* — Anatoly Vortman
(74) *Attorney, Agent, or Firm* — McCoy Russell LLP (57) ABSTRACT

A cooling system for power electronics of an engine-powered unit includes at least one power electronics component, a liquid chamber in thermal communication with a frame of the engine-powered unit, and a pump configured to circulate a cooling fluid through the at least one power electronics component and the liquid chamber. The liquid chamber is configured to conductively transfer heat from the cooling fluid to the frame to cool the cooling fluid.

4 Claims, 6 Drawing Sheets

(56) References Cited

U.S. PATENT DOCUMENTS

| | | | | |
|---|---|---|---|---|
| 5,930,135 A * | 7/1999 | Janko | | F28F 13/00 |
| | | | | 165/104.33 |
| 6,313,991 B1 | 11/2001 | Nagashima et al. | | |
| 6,404,628 B1 | 6/2002 | Nagashima et al. | | |
| 6,450,275 B1 * | 9/2002 | Gabriel | | B60K 6/22 |
| | | | | 165/41 |
| 6,665,189 B1 * | 12/2003 | Lebo | | H01R 13/514 |
| | | | | 211/41.17 |
| 6,747,866 B1 * | 6/2004 | Lebo | | H05K 7/1411 |
| | | | | 211/41.17 |
| 6,757,168 B2 * | 6/2004 | Yatougo | | H05K 7/20145 |
| | | | | 165/80.3 |
| 7,126,299 B2 * | 10/2006 | Jackson | | B60L 7/02 |
| | | | | 318/380 |
| 7,177,153 B2 * | 2/2007 | Radosevich | | B60L 11/12 |
| | | | | 165/80.4 |
| 7,187,568 B2 * | 3/2007 | Radosevich | | H02M 1/44 |
| | | | | 361/699 |
| 7,643,309 B1 * | 1/2010 | Lebo | | H05K 5/06 |
| | | | | 174/520 |
| 8,059,404 B2 * | 11/2011 | Miller | | H05K 7/20927 |
| | | | | 165/104.33 |
| 8,203,839 B2 * | 6/2012 | Dede | | F28F 7/02 |
| | | | | 361/677 |
| 9,007,767 B2 * | 4/2015 | Nakajima | | H02M 7/003 |
| | | | | 165/80.4 |
| 9,030,822 B2 * | 5/2015 | Sharaf | | H05K 7/20927 |
| | | | | 361/699 |
| 9,826,666 B2 * | 11/2017 | France | | H01L 23/427 |
| 9,890,687 B2 * | 2/2018 | Kim | | F01P 7/165 |
| 2004/0003549 A1 | 1/2004 | Lawson | | |
| 2004/0035494 A1 | 2/2004 | Camacho et al. | | |
| 2006/0005736 A1 * | 1/2006 | Kumar | | B60L 11/1801 |
| | | | | 105/1.4 |
| 2009/0015165 A1 | 1/2009 | Jeon et al. | | |
| 2009/0151658 A1 | 6/2009 | Lee | | |
| 2014/0004170 A1 | 1/2014 | Krohen et al. | | |
| 2014/0041709 A1 | 2/2014 | West | | |
| 2014/0124170 A1 * | 5/2014 | Young | | F01P 3/20 |
| | | | | 165/104.14 |
| 2015/0210158 A1 * | 7/2015 | Brindak | | B60K 11/06 |
| | | | | 307/10.1 |

OTHER PUBLICATIONS

International Preliminary Report on Patentability issued in connection with corresponding PCT Application No. PCT/US2015/061336 dated May 23, 2017.

* cited by examiner

SYSTEM AND METHOD FOR COOLING POWER ELECTRONICS

FIELD OF THE INVENTION

Embodiments of the invention relate generally to cooling systems. Other embodiments relate systems for cooling power electronics.

BACKGROUND OF THE INVENTION

Most modern rail locomotives are diesel-electric, in which a diesel engine drives an electrical generator whose output provides power to traction motors to turn the wheels of the locomotive. The diesel engine, which is typically turbocharged, requires a cooling system to limit the temperatures of various engine components. Accordingly, internal combustion engines are known to be designed with internal cooling passages for the circulation of coolant to remove heat energy from the engine components and from lubricating oil which is also circulated throughout the engine to reduce friction.

Similarly, other off-highway vehicles ("OHVs"), such as those used in the mining industry, may employ electrically motorized wheels for propelling or retarding the vehicle. For example, mining dump trucks typically include a large horsepower diesel engine (or other engine) in conjunction with an alternator, a main traction inverter, and a pair of wheel drive assemblies housed within the rear tires of the vehicle. The diesel engine is directly associated with the alternator such that the diesel engine drives the alternator. The alternator powers the main traction inverter, in which semiconductor power switches commutate the alternator output current to provide electrical power to electric drive motors of the two wheel drive assemblies.

Accordingly, rail vehicles and other OHVs may contain power electronics which are utilized to control and manage the conversion of mechanical energy into electrical energy and to control the supply of electrical power to the traction motors of the locomotive, other rail vehicle, or other OHV. These power electronics also require cooling systems to maximize lifespan and to ensure proper operation thereof.

Existing locomotives and other OHVs are, therefore, typically outfitted with a dedicated power electronics cooling system that includes a power electronics-dedicated liquid-to-air heat exchanger, e.g., a radiator having an associated cooling fan, and a pump for circulating a cooling fluid through the power electronics and the radiator. Such existing systems, however, are relatively complex, costly and often times difficult to service in the field.

BRIEF DESCRIPTION OF THE INVENTION

In an embodiment, a cooling system for power electronics of an engine-powered unit includes at least one power electronics component, a liquid chamber in thermal communication with a frame of the engine-powered unit, and a pump configured to circulate a cooling fluid through the at least one power electronics component and the liquid chamber. The liquid chamber is configured to conductively transfer heat from the cooling fluid to the frame to cool the cooling fluid.

In another embodiment, a cooling system for power electronics is provided. The system includes a power electronics cooling loop having a first fluid configured for circulation through at least one power electronics component of an engine-powered unit, and a heat rejection loop having a second fluid configured for circulation through at least at least one liquid chamber. The liquid chamber is in thermal communication with a frame of the engine-powered unit such that heat from the power electronics is transferred to the frame. The power electronics cooling loop is fluidly isolated from, and in thermal communication with, the heat rejection loop.

In yet another embodiment, a method for cooling power electronics of an engine-powered unit is provided. The method includes the steps of circulating a first cooling fluid through a power electronics cooling loop to remove heat from the power electronics, and cooling the first fluid by transferring heat from the first fluid to a frame of the engine-powered unit.

BRIEF DESCRIPTION OF THE DRAWINGS

The present invention will be better understood from reading the following description of non-limiting embodiments, with reference to the attached drawings, wherein below.

DETAILED DESCRIPTION OF THE INVENTION

Reference will be made below in detail to exemplary embodiments of the invention, examples of which are illustrated in the accompanying drawings. Wherever possible, the same reference numerals used throughout the drawings refer to the same or like parts. Although exemplary embodiments of the present invention are described with respect to rail vehicles and other OHVs, embodiments of the invention are also applicable for use with vehicles, generally. In addition, embodiments of the present invention are equally applicable to any type of machinery, motive or non-motive, that includes an internal combustion engine and any other auxiliary components that require cooling, such as associated power electronics. Such vehicles and other machinery are referred to herein as engine-powered units. For example, the embodiments of the present invention are applicable to underground machinery utilized in the mining industry, having dedicated power electronics, as well as to gensets (e.g., stationary generators), hydraulic fracturing rigs, etc. utilized in the drilling industry. In the exemplary embodiments described below, however, the present invention is described in terms of usage with a vehicle having an internal combustion engine, such as a diesel engine, having a turbocharger or compressor for compressing the combustion air to the engine, with the compressed combustion air being cooled by an intercooler. As used herein, the expression "fluidly coupled" or "fluid communication" refers to an arrangement of two or more features such that the features are connected in such a way as to permit the flow of fluid between the features and permits fluid transfer.

Figure 1:
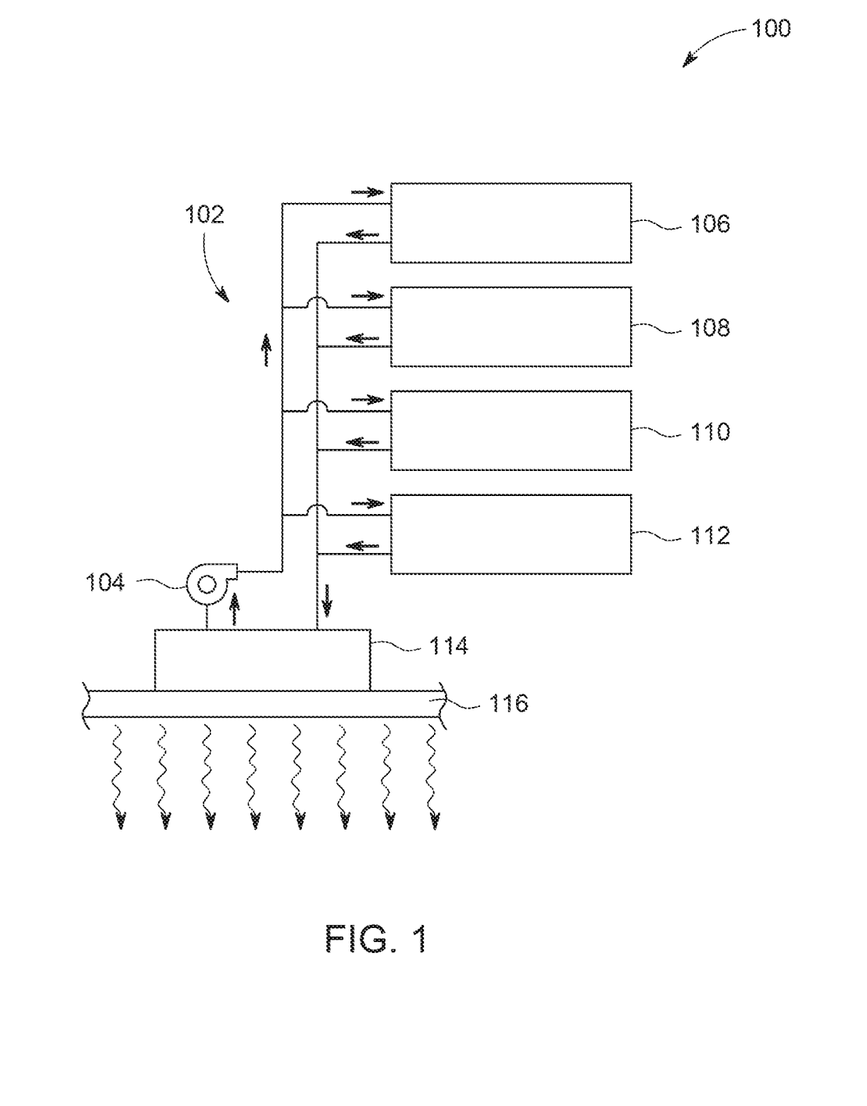
FIG. 1 is a schematic illustration of a non-isolated cooling system according to an embodiment of the invention.

With reference to FIG. 1, embodiments of the invention relate to a cooling system 100 for power electronics that obviates the need to provide a radiator and cooling fan to dissipate heat from power electronics during operation. As used herein, "power electronics" means the electronics employed for the conversion and control of electric power.

As shown in FIG. 1, the cooling system 100 includes a power electronics cooling loop 102. The power electronics cooling loop 102 includes a pump 104 for circulating a cooling fluid within the power electronics cooling loop 102, power electronics, e.g., power electronic components 106, 108, 110, 112, and a liquid/fluid reservoir or chamber 114 in thermal communication with a vehicle or machinery frame 116. As used herein, "thermally interconnected," "thermally connected" and "thermal communication" means that two physical systems or components are associated in such a manner that thermal energy and heat may be transferred between such systems or components. In an embodiment, the cooling fluid is water. In other embodiments, the cooling fluid may be other types of fluids known in the art, such as oil, liquefied gas and the like, without departing from the broader aspects of the present invention. In an embodiment, the pump 106 may be a centrifugal pump, although other types of pumps known in the art may also be utilized without departing from the broader aspects of the present invention.

In an embodiment, the liquid chamber 114 is in direct contact with the vehicle frame 116 such that heat may be conductively transferred from the cooling fluid in the liquid chamber 114 to the vehicle frame 116. In an embodiment, the vehicle frame 116 may be the main support structure for the vehicle, a metal dump body in the case of a mine haul truck, or a secondary vehicle structure such as a deck of a cabinet shell on an OHV. In an embodiment, the frame 116 is a solid/unitary metal mass. More generally, as used herein, "frame" means the metallic structural component(s) of the vehicle connecting the load bearing points that contact the ground. In the case of an OHV, the frame may be at least 100,000 pounds (have a mass of at least 45,000 kg).

In operation, the pump 104 circulates the cooling fluid through the power electronic components 106, 108, 110, 112, whereby heat is transferred to the cooling fluid via a cold plate or direct contact with a surface of the power electronic components. The cooling fluid, with heat transferred from the electronic components 106, 108, 110, 112, is then circulated to the liquid chamber 114. While in the liquid chamber, heat is transferred from the cooling fluid, though the walls of the liquid chamber, to the vehicle frame 116. In particular, the mass of the vehicle frame 116 is utilized to absorb the heat from the cooling fluid and reduce the temperature of the cooling fluid. Over time, the frame 116 will dissipate the absorbed heat to atmosphere. The cooling fluid is then re-circulated within the power electronics cooling loop and through the electronic components 106, 108, 110, 112, and the heat transfer cooling process repeats.

In an embodiment, the mass of the frame 116 can also be used to absorb high heat spikes to allow for limited duration power bursts that are above the convection cooling capability of the vehicle/machinery. As will be readily appreciated, by utilizing a liquid chamber that is in direct contact/communication with the frame of the vehicle, efficient and reliable cooling of the power electronics on-board the vehicle may be realized. In particular, the provision of a liquid chamber in contact with the frame provides for conductive heat transfer from the cooling fluid, to the walls of the cooling chamber, to the frame of the vehicle. As used herein, "conductive heat transfer" means that heat or electricity is directly transmitted through a substance when there is a difference of temperature or of electrical potential between adjoining regions, without movement of the material. In an embodiment, the liquid chamber 114 may be formed as part of the frame such that the cooling fluid is in direct contact with a portion of the frame. In other embodiments, conduits in direct contact with the frame can be utilized to transfer heat from the cooling fluid carried within the conduits to the vehicle frame.

Figure 2:
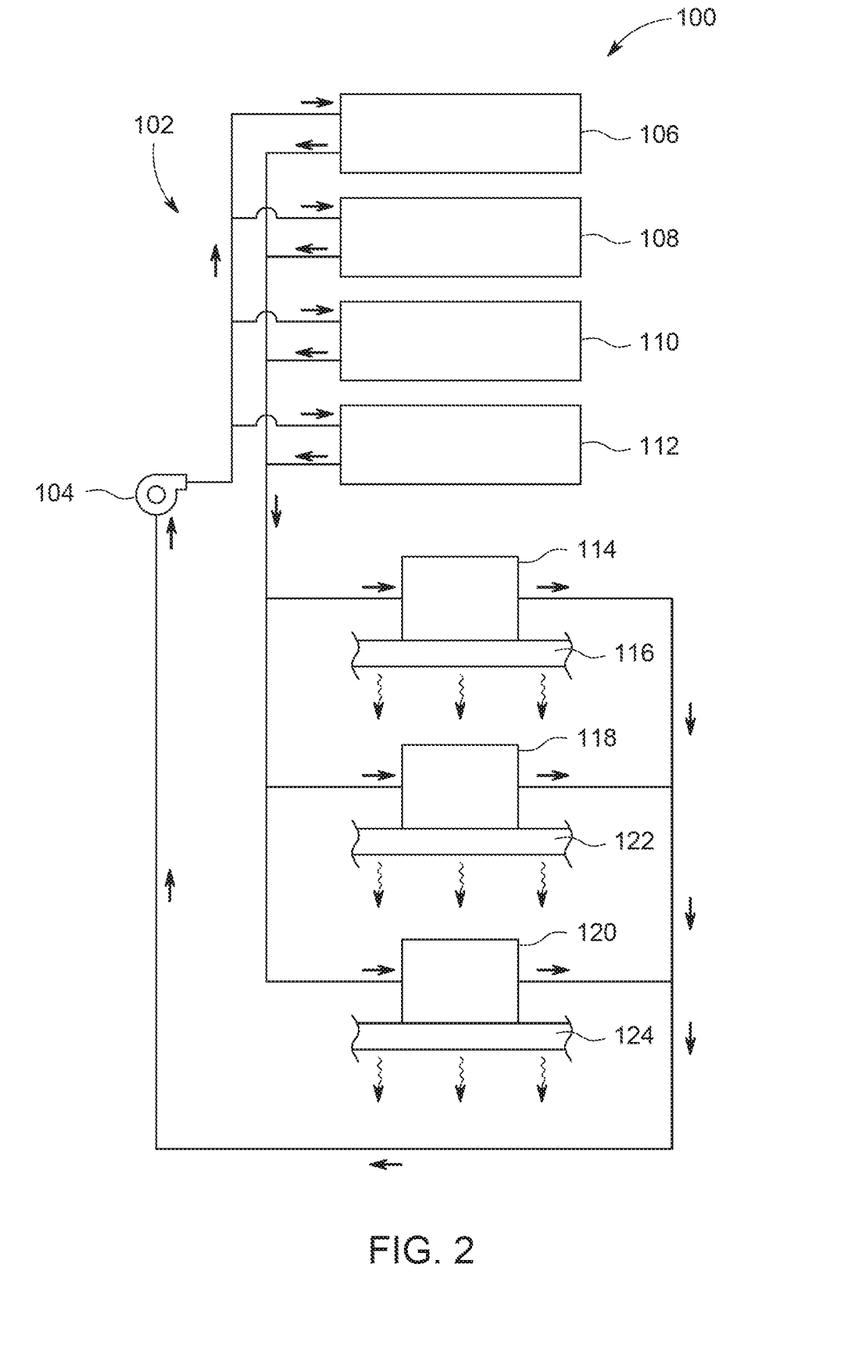
FIG. 2 is a schematic illustration of a non-isolated cooling system according to another embodiment of the invention.

With reference to FIG. 2, in an embodiment, the system 100 may have a plurality of liquid chambers, such as first liquid chamber 114 and additional liquid chambers (such as second liquid chamber 118 and third liquid chamber 120). In an embodiment, the additional liquid chambers 118, 120 may be thermally connected to the same portion of the frame 116 as the first liquid chamber 114. In another embodiment, the second and third liquid chambers 118, 120 may be thermally connected to different portions of the vehicle frame, such as a second frame portion 122 and a third frame portion 124. For example, the first liquid chamber 114 may be connected to the main support structure of the vehicle, while the second and third liquid chambers 118, 120 may be connected to the dump body of the vehicle, such as where the vehicle is a mine haul truck. As will be readily appreciated, the provision of additional liquid chambers functions to increase the cooling capacity of the cooling system 100.

Figure 3:
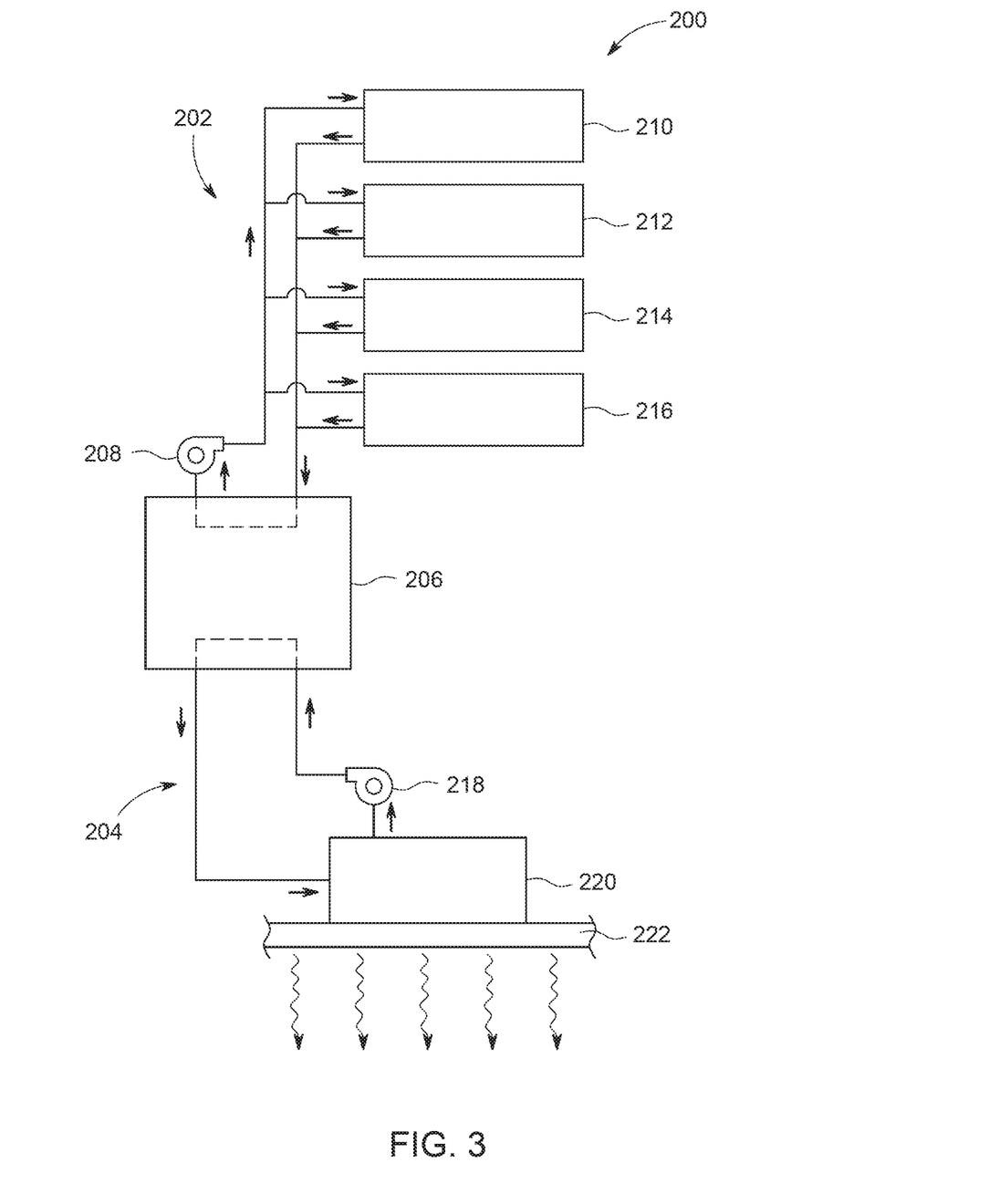
FIG. 3 is a schematic illustration of an isolated cooling system according to an embodiment of the invention.

Turning now to FIG. 3, in an embodiment, a cooling system 200 for power electronics includes a power electronics cooling loop 202 and a heat rejection loop 204 that are thermally interconnected through a liquid-to-liquid heat exchanger 206. As shown therein, the power electronics cooling loop 202 is fluidly isolated from (but thermally integrated with) the heat rejection loop 204. As used herein, "fluidly isolated" means that a fluid is not able to mix or directly contact another fluid or component.

As shown therein, the power electronics cooling loop 202 includes a first pump 208 for circulating a first cooling fluid within the power electronics cooling loop 202, power electronics, e.g., power electronic components 210, 212, 214, 216 and the liquid-to-liquid heat exchanger 206. In an embodiment, the first cooling fluid is water. In other embodiments, the cooling fluid may be other types of fluids known in the art, such as oil, liquefied gas and the like, without departing from the broader aspects of the present invention. In an embodiment, the pump 208 may be a centrifugal pump, although other types of pumps known in the art may also be utilized without departing from the broader aspects of the present invention.

As further shown in FIG. 3, the heat rejection loop 204 includes a second pump 218 for circulating a second cooling fluid through the heat rejection loop 204, the liquid-to-liquid heat exchanger 206, and a liquid chamber 220 in thermal communication with a vehicle or machinery frame 222. In an embodiment, the pump 218 may be a centrifugal pump, although other types of pumps known in the art may also be utilized without departing from the broader aspects of the present invention. As with the cooling system 100, in an embodiment, the liquid chamber 220 of the cooling system 200 is in direct contact with the vehicle frame 222 such that heat may be conductively transferred from the second cooling fluid in the liquid chamber 220 to the vehicle frame 222, as discussed hereinafter. In an embodiment, the vehicle frame 222 may be the main support structure for the vehicle, a metal dump body in the case of a mine haul truck, or a secondary vehicle structure such as a deck of a cabinet shell on an OHV. In an embodiment, the frame 222 is a solid/unitary metal mass. As used herein, "secondary structure" means a structure other than that utilized as the main support structure for a vehicle.

In operation, the first pump 208 circulates the first cooling fluid through the power electronic components 210, 212, 214, 216 to remove heat therefrom. The first cooling fluid, with heat transferred from the electronic components 210, 212, 214, 216, then passes through the liquid-to-liquid heat exchanger 206. In this manner, heat carried away from the power electronic components 210, 212, 214, 216 is then transferred, through the heat exchanger 206, to the second cooling fluid within the heat rejection loop 204. The cooled, first fluid within the power electronics cooling loop 202 is then re-circulated through the power electronic components 210, 212, 214, 216, and the heat transfer cooling process repeats.

In connection with the above, as the first cooling fluid is circulated through the heat exchanger 206, heat is transferred from the first fluid to the second cooling fluid circulated within the heat rejection loop 204 by the second pump 218. After heat is transferred from the first cooling fluid to the second cooling fluid, the second cooling fluid is circulated, by operation of the second pump 218, to the liquid chamber 220. While in the liquid chamber 220, heat is transferred from the second cooling fluid, though the walls of the liquid chamber 220, to the vehicle frame 222. In particular, the mass of the vehicle frame 222 is utilized to absorb the heat from the second cooling fluid and reduce the temperature of the second cooling fluid. Over time, the frame 222 will dissipate the absorbed heat to atmosphere, in the manner hereinbefore described. The second cooling fluid is then re-circulated to the liquid-to-liquid heat exchanger in order to repeat the cooling process.

As noted above, the power electronics cooling loop 202 and the heat rejection loop 204 are integrated via the heat exchanger 206. As will be readily appreciated, the heat exchanger 206 allows the cooling fluid in each loop 202, 204 to remain physically separate from one other, but allows the respective cooling fluids to be thermally connected so as to provide for the dissipation of heat from the power electronics. As will be readily appreciated, this 'isolated' system 200 functions to isolate the power electronics components 210, 212, 214, 216 from the frame cooling structure, such that the second fluid that dissipates heat through the vehicle frame 222 does not enter the power electronics components 210, 212, 214, 216.

Figure 4:
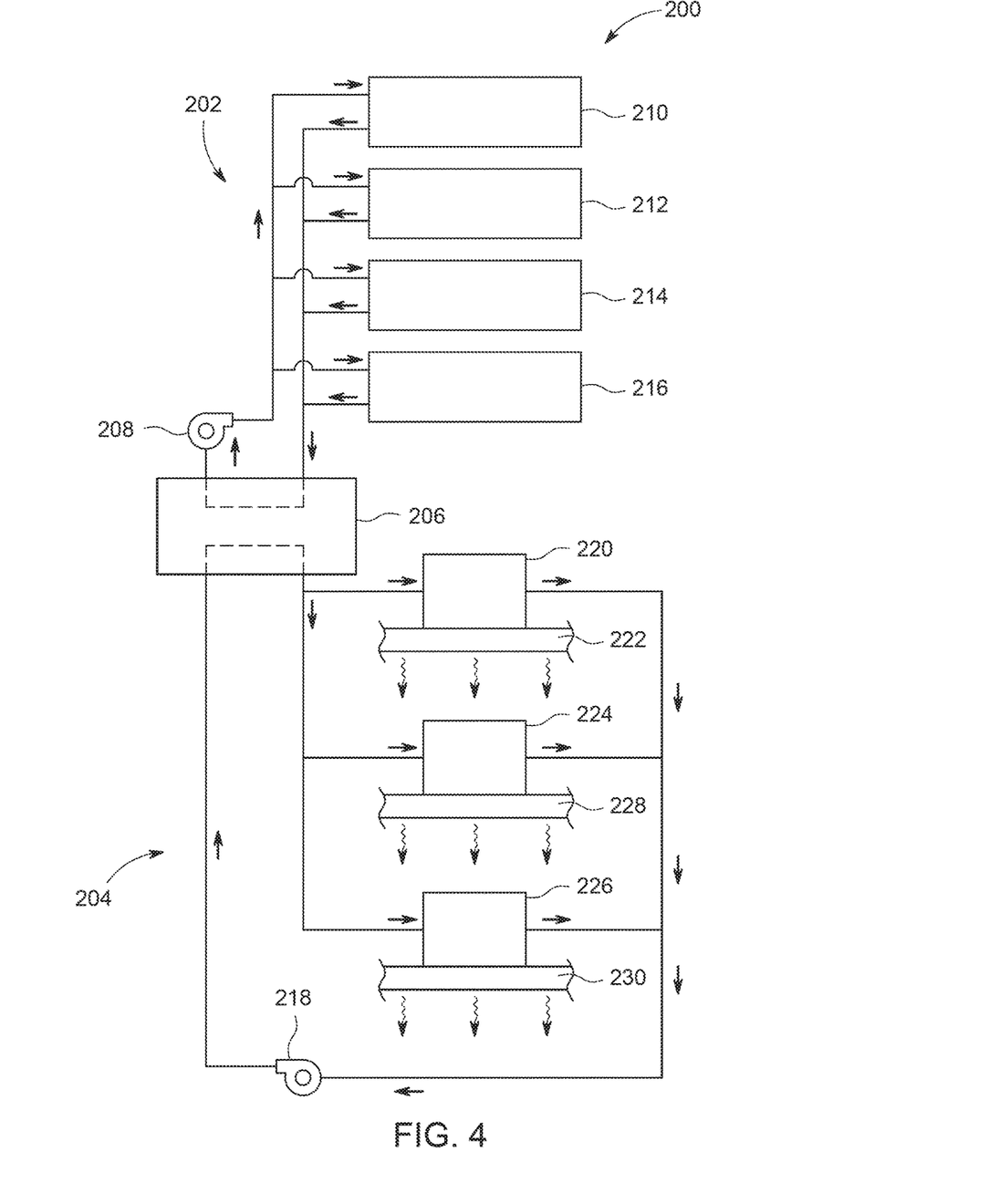
FIG. 4 is a schematic illustration of an isolated cooling system according to another embodiment of the invention.

With reference to FIG. 4, in an embodiment, the system 200 may have a plurality of liquid chambers, such as first liquid chamber 220 and additional liquid chambers (such as second liquid chamber 224 and third liquid chamber 226). In an embodiment, the additional liquid chambers 224, 226 may be thermally connected to the same portion of the frame 222 as the first liquid chamber 220. In another embodiment, the second and third liquid chambers 224, 226 may be thermally connected to different portions of the vehicle frame, such as a second frame portion 228 and a third frame portion 230. For example, as with system 100, the first liquid chamber 220 may be connected to the main support structure of the vehicle, while the second and third liquid chambers 224, 226 may be connected to the dump body of the vehicle, such as where the vehicle is a mine haul truck. As discussed above, the provision of additional liquid chambers functions to increase the cooling capacity of the cooling system 200.

Figure 5:
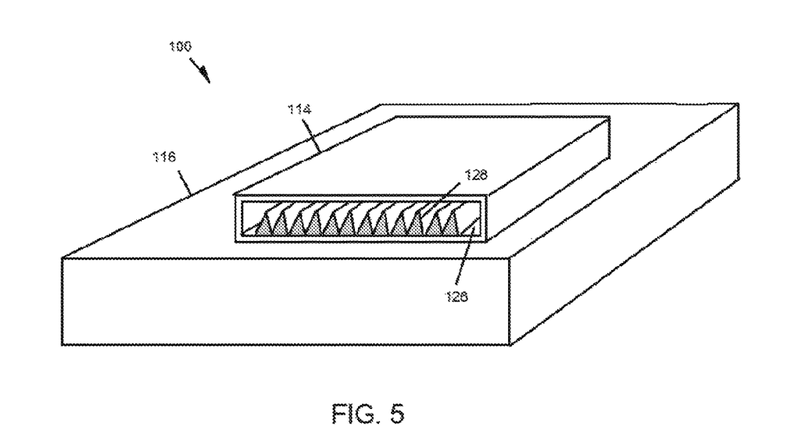
FIG. 5 is a schematic perspective view of a cooling system, according to another embodiment.
Figures 6, 7, 8:
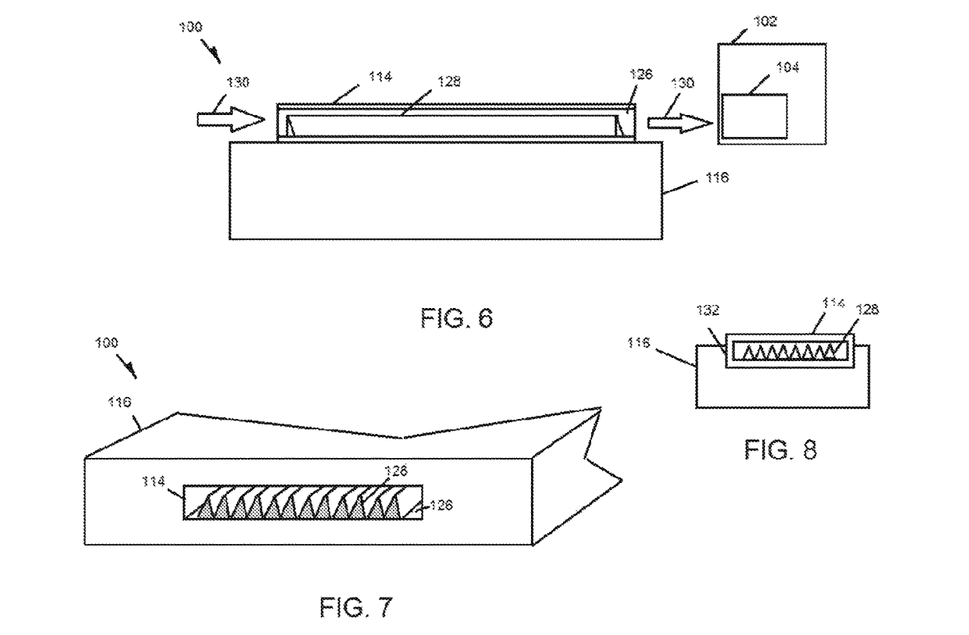
FIG. 6 is a schematic side view, partially in cross section, of the cooling system of FIG. 5.
FIG. 7 is a schematic perspective view of another embodiment of a cooling system.
FIG. 8 is a schematic end view of another embodiment of a cooling system.

FIGS. 5 and 6 show an additional embodiment of the cooling system 100, as an example of how a liquid chamber 114 can be interfaced with a frame 116 for heat transfer. As shown, in this embodiment the liquid chamber 114 includes an elongate duct body with a hollow interior 126. (The hollow interior may extend longitudinally along a length of the duct body.) The liquid chamber further includes plural fins 128 inside the hollow interior 126, which are attached to the side of the duct body that it attached to or otherwise coupled with the frame 116. An inlet and an outlet of the hollow interior are fluidly coupled as part of the power electronics cooling loop 102. The duct body and/or fins may be made in whole or in part from one or more metal materials, to facilitate heat transfer, or from other materials that provide a suitable degree of heat transfer in light of the given implementation (e.g., size of the duct body, frame mass, and so on). In operation, cooling fluid 130 that has received transferred heat from power electronics is pumped through the hollow interior of the duct body. Heat from the cooling fluid is transferred from the cooling fluid to the duct body and to the frame. The fins 128 increase the surface area of contact between the cooling fluid and duct body, thereby facilitating a greater degree of heat transfer (than a duct without such fins, for example).

In other embodiments, the fins 128 may be bolted or otherwise connected directly to the frame, with the duct body placed over the fins to define a fluid flow path (i.e., the interior 126). In other embodiments, the fins 128 may be integral with the frame or frame component, e.g., formed of the same piece of metal or other material, such as by casting, machining, etc. In other embodiments, the fluid flow path may be defined at least partially by the frame. For example, with reference to FIG. 7, the frame may be provided with a through channel (i.e., a channel completely enclosed by the body member/material of the frame) that defines the liquid chamber 114. (Fins 128 may be disposed in the through channel.) As another example, with reference to FIG. 8, the frame may be provided with an exterior channel 132 into which the duct body of the liquid chamber is disposed. The channel 132 in effect increases the surface area of contact between the liquid chamber and frame, thereby increasing the degree of heat transfer versus the embodiment of FIGS. 5-6 (for example).

In any of the embodiments herein, including those of FIGS. 5-8, the frame may be a single unity metal piece (i.e., part of the overall vehicle frame) having a mass of at least 1300 kg (3000 lb). In any of the embodiments herein, including those of FIGS. 5-8, according to another aspect, the frame may be a single unity metal piece (i.e., part of the overall vehicle frame) having a mass of at least 2200 kg (5000 pounds). This reflects that according to aspects of the invention, the cooling system may be deployed in relatively large vehicles having large, massive frame members (e.g., dump beds), which may provide enough of a metal mass and heat sink to warrant (in terms of cost and added vehicle system complexity) the provision of the liquid chamber, pump, etc.

Figure 9:
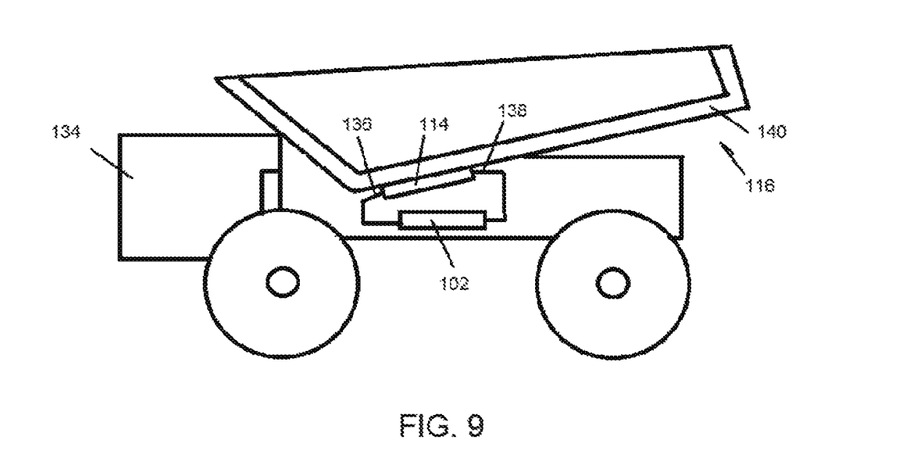
FIG. 9 is a schematic side view of another embodiment of a cooling system.

FIG. 9 shows another embodiment of a cooling system 100, in place in a mine haul truck or other haul truck 134. Here, the liquid chamber 114 (e.g., as shown in any of FIGS. 5-8) is attached to a metal dump body portion 140 of the frame 116, e.g., to the underside of the dump body. The liquid chamber 114 is fluidly coupled to the cooling loop 102 via one or more flexible couplers 136, 138 (e.g., flexible pipe sections), which allow the liquid chamber to move relative to the cooling loop (due to the dump body pivoting for dumping) while still maintain a fluid connection.

As will be readily appreciated, in contrast to existing systems, the cooling system of the present invention does not require a separate radiator-style heat exchanger system to dissipate heat to atmosphere. Such existing systems typically include numerous components such as a tube and fin radiator, a liquid reservoir, and a cooling fan, all of which have reliability and cost considerations. By utilizing a vehicle or machinery frame to dissipate heat, the cooling system of the present invention allows for a simple, low cost, and more reliable mechanism for removing heat generated by the operation of power electronics.

In addition to the above, the cooling system of the present invention is extremely reliable and is easily serviceable in the field in comparison to existing radiator-style cooling systems. Typically, radiator core leaks can only be repaired in the field by plugging the leaking section of the radiator, which can reduce overall performance of the cooling system. Utilizing the vehicle frame to dissipate heat, however, allows for simple weld repairs to the liquid holding chambers that do not substantially impact system performance.

An embodiment of the present invention relates to a cooling system for power electronics of an engine-powered unit. The system includes at least one power electronics component, a liquid chamber in thermal communication with the frame of an engine-powered unit, and a pump configured to circulate a cooling fluid through the at least one power electronics component and the liquid chamber. The liquid chamber is configured to conductively transfer heat from the cooling fluid to the frame to cool the cooling fluid.

In an embodiment, the frame may be the main support structure of the engine-powered unit. In another embodiment, the engine-powered unit may be a mine haul truck, and the frame may be a metal dump body of the mine haul truck. In yet another embodiment, the frame is a secondary structure comprised of metal other than a main support structure of the engine-powered unit.

In an embodiment, the at least one liquid chamber is a plurality of liquid chambers. One of the liquid chambers may be coupled to a first portion of the frame, and another of the liquid chambers may be coupled to a second portion of the frame. The first portion of the frame may be a different component than the second portion of the frame, and may have a different function than the second portion of the frame.

In another embodiment, a cooling system for power electronics is provided. The system includes a power electronics cooling loop having a first fluid configured for circulation through at least one power electronics component of an engine-powered unit, and a heat rejection loop having a second fluid configured for circulation through at least at least one liquid chamber. The liquid chamber is in thermal communication with a frame of the engine-powered unit such that heat from the power electronics is transferred to the frame. The power electronics cooling loop is fluidly isolated from, and in thermal communication with, the heat rejection loop.

In an embodiment, the frame may be a main support structure of the engine-powered unit. In an embodiment, the frame may be a metal dump body of the engine-powered unit. In another embodiment, the frame may be a secondary structure comprised of metal other than a main support structure of the engine-powered unit.

In an embodiment, the at least one liquid chamber is a plurality of liquid chambers. One of the liquid chambers may be coupled to a first portion of the frame, and another of the liquid chambers may be coupled to a second portion of the frame. The first portion of the frame may be a different component than the second portion of the frame, and may have a different function than the second portion of the frame.

In an embodiment, the cooling system may include a first pump configured to circulate the first fluid throughout the power electronics cooling loop and a second pump configured to circulate the second fluid throughout the heat rejection loop.

In an embodiment, the power electronics cooling loop and the heat rejection loop are in thermal communication with one another via a heat exchanger. In an embodiment, the heat exchanger is a liquid-to-liquid heat exchanger, through which heat is transferred from one of the first fluid and the second fluid to the other of the first fluid and the second fluid.

In yet another embodiment, a method for cooling power electronics of an engine-powered unit is provided. The method includes the steps of circulating a first cooling fluid through a power electronics cooling loop to remove heat from the power electronics, and cooling the first fluid by transferring heat from the first fluid to a frame of the engine-powered unit.

In an embodiment, the method may include the step of cooling the frame by transferring heat from the frame to atmosphere.

In an embodiment, the frame is a main support structure of the engine-powered unit. In another embodiment, the engine-powered unit may be a mine haul truck, and the frame may be a metal dump body of the mine haul truck. In another embodiment, the frame is a secondary structure comprised of metal other than a main support structure of the engine-powered unit.

In an embodiment, the method may further include the steps of circulating a second fluid through a heat rejection loop having a liquid chamber in thermal communication with the frame, and cooling the first fluid by transferring heat from the first fluid to the second fluid. In an embodiment, the power electronics cooling loop and the heat rejection loop are fluidly isolated from one another. The step of cooling the first fluid includes passing the first fluid and the second fluid through a liquid-to-liquid heat exchanger.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the cooling system, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A cooling system for power electronics, comprising:
at least one power electronics component;
a liquid chamber in thermal communication with a frame of an engine-powered unit; and
a pump configured to circulate a cooling fluid through the at least one power electronics component and the liquid chamber;
wherein the liquid chamber is configured to conductively transfer heat from the cooling fluid to the frame;
wherein the engine-powered unit is a haul truck and the frame is a metal dump body of the haul truck; and
wherein the metal dump body comprises a unitary metal piece having a mass of at least 1300 kg, and wherein the metal dump body includes a channel completely enclosed by the metal dump body, the channel defining the liquid chamber, and further comprising one or more flexible couplers fluidly coupling the channel to the pump and the at least one power electronic component, the at least one power electronic component located on the haul truck but off the metal dump body.

2. A method for cooling power electronics of an engine-powered unit, the method comprising the steps of:
circulating a cooling fluid through a power electronics cooling loop to remove heat from the power electronics; and
cooling the fluid by transferring heat from the fluid to a frame of the engine-powered unit;
wherein the engine-powered unit is a haul truck and the frame is a metal dump body of the haul truck; and
wherein the metal dump body comprises a unitary metal piece having a mass of at least 1300 kg, and wherein the metal dump body includes a channel completely enclosed by the metal dump body, the channel receiving the cooling fluid, and wherein circulating the cooling fluid comprises routing the cooling fluid through one or more flexible couplers fluidly coupling the channel to a pump and the power electronics, the power electronics located on the haul truck but off the metal dump body.

3. The method according to claim 2, further comprising the step of:
cooling the frame by transferring heat from the frame to atmosphere.

4. A cooling system for power electronics, comprising:
a power electronics cooling loop having a first fluid configured for circulation through at least one power electronics component of a haul truck;
a heat rejection loop having a second fluid configured for circulation through a liquid chamber, the liquid chamber being in thermal communication with a metal dump body of the haul truck, wherein the metal dump body comprises a unitary metal piece having a mass of at least 1300 kg, and wherein the metal dump body includes a channel completely enclosed by the metal dump body, the channel defining the liquid chamber, wherein the power electronics cooling loop is fluidly isolated from, and in thermal communication with, the heat rejection loop, and wherein the liquid chamber is configured to conductively transfer heat from the second fluid to the metal dump body;
a first pump configured to circulate the first fluid through the at least one power electronics component and the power electronics cooling loop;
a second pump configured to circulate the second fluid through the liquid chamber and the heat rejection loop;
one or more flexible couplers fluidly coupling the channel to the second pump, the at least one power electronic component and the second pump located on the haul truck but off the metal dump body; and
a heat exchanger coupled to the first pump and the second pump and configured for the exchange of heat from the first fluid to the second fluid.

* * * * *